US010217925B2

(12) United States Patent
Richter et al.

(10) Patent No.: US 10,217,925 B2
(45) Date of Patent: Feb. 26, 2019

(54) METHOD FOR PRODUCING AN ELECTRONIC STRUCTURAL ELEMENT AS A STACK

(71) Applicant: Continental Automotive GmbH, Hannover (DE)

(72) Inventors: Thomas Richter, Regensburg (DE); Claus Zumstrull, Regenstauf (DE)

(73) Assignee: CONTINENTAL AUTOMOTIVE GMBH, Hanover (DE)

( * ) Notice: Subject to any disclaimer, the term of this patent is extended or adjusted under 35 U.S.C. 154(b) by 310 days.

(21) Appl. No.: 15/347,350

(22) Filed: Nov. 9, 2016

(65) Prior Publication Data

US 2017/0062695 A1 Mar. 2, 2017

Related U.S. Application Data

(62) Division of application No. 14/417,960, filed as application No. PCT/EP2013/071375 on Oct. 14, 2013.

(30) Foreign Application Priority Data

Oct. 15, 2012 (DE) .................. 10 2012 218 755

(51) Int. Cl.
*H01L 41/047* (2006.01)
*H01L 41/083* (2006.01)
(Continued)

(52) U.S. Cl.
CPC ...... *H01L 41/0471* (2013.01); *H01L 41/0472* (2013.01); *H01L 41/09* (2013.01);
(Continued)

(58) Field of Classification Search
CPC . H01L 41/0471; H01L 41/0472; H01L 41/09; H01L 41/27; H01L 41/273; H01L 41/293; H01L 41/297
(Continued)

(56) References Cited

U.S. PATENT DOCUMENTS 4,887,186 A   12/1989 Takeda et al. ............. 361/321.4
5,735,027 A   4/1998 Hageman et al. ........... 29/25.35
(Continued)

FOREIGN PATENT DOCUMENTS

DE       19913271 A1    9/2000  ........... H01L 41/047
DE    102010063205 A1   6/2012  ............. H01L 41/04
(Continued)

OTHER PUBLICATIONS

U.S. Non-Final Office Action, U.S. Appl. No. 14/417,960, 16 pages, dated Mar. 13, 2017.
(Continued)

*Primary Examiner* — Thomas Dougherty
(74) *Attorney, Agent, or Firm* — Slayden Grubert Beard PLLC

(57) ABSTRACT

A method of forming an electronic structural element having a stack including first and second electrode layers arranged alternatively with material layers is disclosed. A stack is formed with the first electrode layers projecting beyond a first lateral side of the stack and the second electrode layers spaced radially inward from the first lateral side. A first contacting structure that contacts each first electrode layer is applied directly to the first side of the stack, which contacting structure embeds such the projecting first electrode layers in an electrically conductive manner. A second contacting structure is formed by exposing the first and second electrode layers at a second side of the stack, forming, by an additive method, a solvent-free insulating structure that
(Continued)

electrically insulates the first electrode layers, and applying an electrically conductive material over the solvent-free insulating structure to form the second contacting structure that contacts each second electrode layer.

7 Claims, 3 Drawing Sheets

(51) Int. Cl.

| | | |
|---|---|---|
| H01L 41/273 | (2013.01) | |
| H01L 41/293 | (2013.01) | |
| H01L 41/297 | (2013.01) | |
| H01L 41/27 | (2013.01) | |
| H01L 41/09 | (2006.01) | |

(52) U.S. Cl.
CPC ............ *H01L 41/27* (2013.01); *H01L 41/273* (2013.01); *H01L 41/293* (2013.01); *H01L 41/297* (2013.01); *Y10T 29/42* (2015.01)

(58) Field of Classification Search
USPC .......................................................... 310/366
See application file for complete search history.

(56) References Cited

U.S. PATENT DOCUMENTS

| | | | |
|---|---|---|---|
| 6,573,639 B1 | 6/2003 | Heinz et al. .................. 310/363 |
| 6,621,682 B1 | 9/2003 | Takakuwa et al. ........ 361/306.3 |
| 8,006,358 B2 * | 8/2011 | Cooke ..................... B29C 39/18 |
| | | | 29/25.35 |
| 2002/0051042 A1 | 5/2002 | Takagi et al. .................... 347/72 |
| 2003/0076009 A1 * | 4/2003 | Hoffman ............... B06B 1/0603 |
| | | | 310/332 |
| 2004/0155944 A1 | 8/2004 | Takagi et al. .................... 347/68 |
| 2004/0183396 A1 | 9/2004 | Iwase et al. ................... 310/311 |
| 2006/0067029 A1 | 3/2006 | Kuniyasu ...................... 361/302 |
| 2007/0094856 A1 | 5/2007 | Miyoshi ........................ 29/25.35 |
| 2008/0222866 A1 | 9/2008 | Miyoshi ........................ 29/25.35 |
| 2010/0141098 A1 | 6/2010 | Doellgast et al. ............ 310/363 |
| 2011/0101829 A1 | 5/2011 | Dernovsek et al. .......... 310/363 |

FOREIGN PATENT DOCUMENTS

| | | | | |
|---|---|---|---|---|
| EP | 0113999 A1 | 7/1984 | ........... H01L 41/083 |
| EP | 1107325 A2 | 6/2001 | ........... H01L 41/083 |
| EP | 1835553 A1 | 9/2007 | ........... H01L 41/047 |
| JP | 06314829 A | 11/1994 | ............. C25D 13/02 |
| JP | 10208978 A | 8/1998 | ............. H01C 1/148 |
| JP | 2003109839 A | 4/2003 | ............... H01G 4/12 |
| JP | 2003347152 A | 12/2003 | ............... H01G 4/12 |
| JP | 2005183478 A | 7/2005 | ........... H01L 41/083 |
| WO | 2008/025793 A1 | 3/2008 | ........... H01L 41/047 |
| WO | 2014/060327 A1 | 4/2014 | ........... H01L 41/047 |

OTHER PUBLICATIONS

International Search Report and Written Opinion, Application No. PCT/EP2013/071375, 10 pages, dated Feb. 10, 2014.

U.S. Final Office Action, U.S. Appl. No. 14/417,960, 14 pages, dated Oct. 3, 2017.

* cited by examiner

METHOD FOR PRODUCING AN ELECTRONIC STRUCTURAL ELEMENT AS A STACK

CROSS-REFERENCE TO RELATED APPLICATIONS

This application is a Divisional of U.S. application Ser. No. 14/417,960 filed Jan. 28, 2015, which is a U.S. National Stage Application of International Application No. PCT/EP2013/071375 filed Oct. 14, 2013, which designates the United States of America, and claims priority to DE Application No. 10 2012 218 755.3 filed Oct. 15, 2012, the contents of which are hereby incorporated by reference in their entirety.

TECHNICAL FIELD

The invention relates to methods for producing an electronic structural element as a stack and to a structural element produced as a stack. Such a structural element is used, for example, as an actuator unit for the injection of fuels into a combustion space of a cylinder of an internal combustion engine.

BACKGROUND

An actuator unit for an injection valve of an internal combustion engine of a vehicle typically comprises a structural element which is formed as a stack and which has a plurality of electrode layers and a plurality of material layers reacting to the application of an electrical field, each material layer being arranged between two of the electrode layers. Such a structural element of layers of material layer and electrode layer which are stacked one above the other and alternately to one another is designated in general as a stack. The currently best known electronic structural element of this type is a stack which is designated in general as a piezo-actuator and which is employed as an actuation element in injection valves of the most diverse possible engine types for motor vehicles. In this piezo-actuator, the material layers are ceramic layers.

Conventionally, such a stack, as seen in a top view, has a rectangular or square cross section. The stack is typically contacted electrically on two circumferential sides lying opposite one another. So that this can be carried out in a technologically careful way, the electrode layers are, for example, designed geometrically such that only every second electrode layer extends laterally as far as one of the two circumferential sides, whereas the in each case other electrode layers do not extend as far as this one circumferential side.

The same applies correspondingly to the other circumferential side of the stack. Furthermore, fully active stacks, as they may be referred to, are known, in which the electrode layers and the material layers have the same area, with the result that all the electrode layers extend in each case up to the circumferential sides lying opposite one another.

In both cases, the electrical contacting of the electrode layers takes place via two external electrodes which are connected electrically to respective electrode layers, in general, on at least one circumferential side of the structural element and, typically, on two circumferential sides lying opposite one another. The type of contacting depends in this case on whether the stack is fully active or not.

Where a fully active stack is concerned, passivation is applied to the respective circumferential sides in order to generate the external electrodes. Subsequently, every second electrode is exposed by means of subtractive methods by pits or recesses being generated in the passivation. An electrically conductive material, such as, for example, a conductive adhesive, is thereupon applied to the passivation, penetrates into the pits or recesses and makes electrical contact with the electrode layers. This procedure entails some disadvantages.

For the passivation, it is necessary to have a material which can subsequently be removed in a targeted way and is temperature-resistant up to 190° C. These requirements necessitate the material group of polyimides which, however, contain solvents harmful to health. During manufacture, therefore, these solvent require measures for protecting the health of employees, thus making the processes more complicated. The same applies to the conductive adhesive by which further contacting takes place after the exposure of the electrodes.

The finished structural element is surrounded by a tube spring which is typically composed of a metal. The tube spring serves to prestress the structural element stack when the actuator unit is in operation. Furthermore, the tube spring serves for providing sufficient performance for the deflected structural element stack. As insulating material between the tube spring and the external electrodes of the structural element stack, a layer, for example of silicone, which covers at least the external electrodes, is provided on the outer circumference of the structural element stack.

EP 1 835 553 A1 discloses a method for producing a piezoelectric actuator, in which the contacting structure is applied to an insulating layer which is applied subtractively or additively to corresponding stack circumferential regions.

SUMMARY

One embodiment provides a method for producing an electronic structural element as a stack, which is formed from a plurality of material layers reacting to the application of an electrical field and a plurality of first and second electrode layers, each material layer being arranged alternately between a first and a second electrode layer, in which at least one first and one second contacting structure are applied to at least one stack circumferential region, so that every first electrode layer is contacted electrically by the first contacting structure and every second electrode layer is contacted electrically by the second contacting structure; wherein (a) a stack is generated, in which the first electrode layers project above the at least one stack circumferential region, and the second electrode layers come to lie within the material layers at a distance from the at least one stack circumferential region; (b) the first contacting structure is applied directly to the at least one stack circumferential region, the first electrode layers which project from the at least one stack circumferential region being embedded in an electrically conductive manner into the first contacting structure; and (c) the second contacting structure is generated such that: the first and second electrode layers are exposed on the at least one stack circumferential region; a solvent-free insulating structure is generated by means of an additive method and insulates the first electrode layers electrically from the at least one stack circumferential region; and electrically conductive material is applied to the prepared stack circumferential region in order to form the second contacting structure.

In a further embodiment, step a) comprises the provision of an unsintered stack composed of the alternately arranged material layers and first and second electrode layers, the material layers, the first electrode layers, which are to be connected to the first contacting structure, and the second electrode layers, which are to be connected to the second contacting structure, having a different shrinkage behavior during sintering.

In a further embodiment, step a) comprises the sintering of the stack, with the result that the first electrode layers project above the at least one stack circumferential region, and the second electrode layers come to lie within the material layers at a distance from the at least one stack circumferential region.

In a further embodiment, the materials of the first and second electrode layers and the material layers are selected in such a way that, during the sintering of the stack, the second electrode layers shrink to a greater extent than the material layers and the material layers shrink to a greater extent than the first electrode layers.

In a further embodiment, step b) comprises the burning of the material of the first contacting structure onto the at least one stack circumferential region.

In a further embodiment, the exposure of the second electrode layers on the at least one stack circumferential region in step c) comprises the grinding of the at least one stack circumferential region.

In a further embodiment, the first and the second contacting structure are formed on different stack circumferential regions.

In a further embodiment, the generation of the insulating structure takes place by electrochemical deposition in that voltage is applied to the first contacting structure.

Another embodiment provides an electronic structural element formed as a stack, comprising: a plurality of first and second electrode layers; a plurality of material layers reacting to the application of an electrical field, each material layer being arranged alternately between a first and a second electrode layer; a first and a second contacting structure which are applied to at least one stack circumferential region, so that every first electrode layer is contacted electrically by the first contacting structure and every second electrode layer is contacted electrically by the second contacting structure; wherein the first contacting structure is applied directly to the at least one stack circumferential region, the first electrode layers which project from the at least one stack circumferential region being embedded in an electrically conductive manner into the first contacting structure; and wherein the second contacting structure is applied to a solvent-free insulating structure of the at least one stack circumferential region of the stack and is connected electrically to the second electrode layers.

BRIEF DESCRIPTION OF THE DRAWINGS

The production of a structural element according to example embodiments of the invention is explained in more detail below with reference to the drawings, in which.

DETAILED DESCRIPTION

Figure 1:
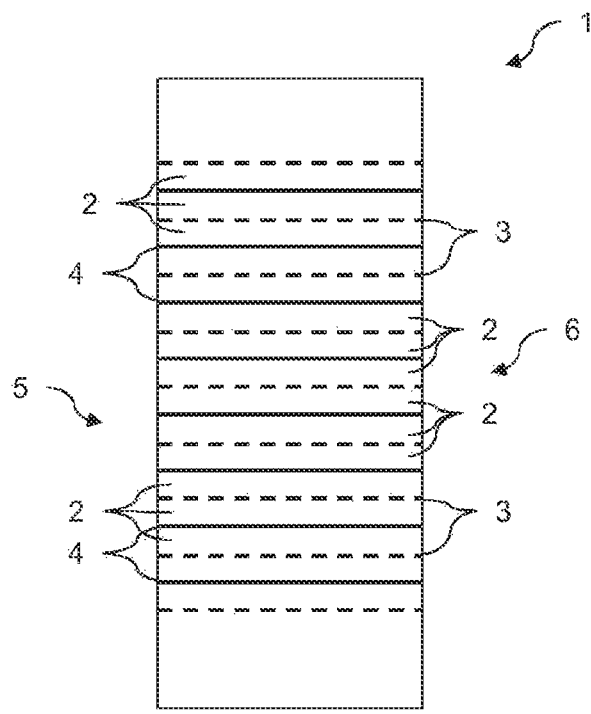
FIG. 1 shows a stack of alternately arranged material layers and electrode layers before sintering in a diagrammatic cross-sectional illustration.
Figure 2:
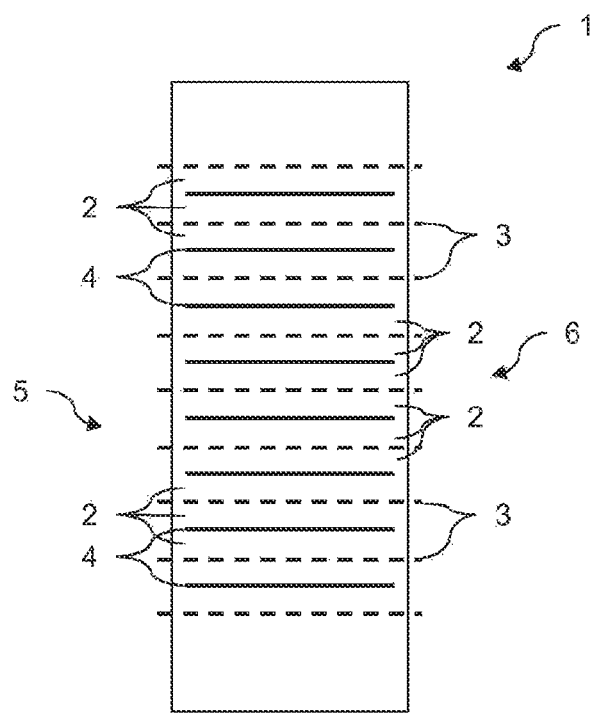
FIG. 2 shows the stack of alternately arranged material layers and electrode layers after sintering in a diagrammatic cross-sectional illustration.
Figure 3:
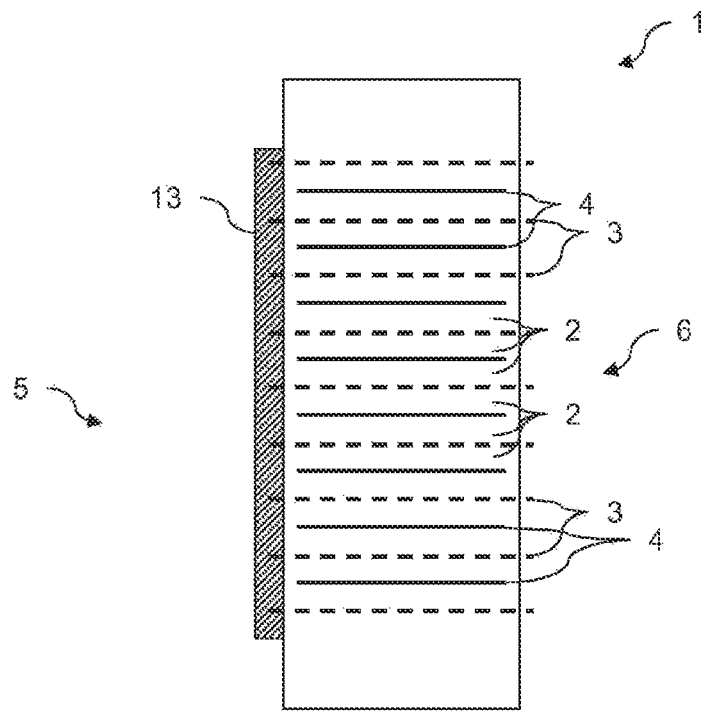
FIG. 3 shows the stack after the application of a first contacting structure for contacting first electrode layers in a diagrammatic cross-sectional illustration.

Embodiments of the present invention provide a method for producing a structural element, which is improved in terms of aspects harmful to health during the production run. Furthermore, the object of the invention is to specify a structural element produced according to the method.

One embodiment provides a method for producing an electronic structural element as a stack, which is formed from a plurality of material layers reacting to the application of an electrical field and from a plurality of first and second electrode layers, each material layer being arranged alternately between a first and a second electrode layer. At least one first and one second contacting structure are applied to at least one stack circumferential region, so that every first electrode layer is contacted electrically by the first contacting structure and every second electrode layer is contacted electrically by the second contacting structure. First, a stack is generated, in which the first electrode layers project beyond the at least one stack circumferential region, and the second electrode layers come to lie within the material layers at a distance from the at least one stack circumferential region. Subsequently, the first contacting structure is applied directly to the at least one stack circumferential region, the first electrode layers which project from the at least one stack circumferential region being embedded in an electrically conductive manner into the first contacting structure. The second contacting structure is then generated in that the first and second electrode layers are exposed on the at least one stack circumferential region, a solvent-free insulating structure is furthermore generated by means of an additive method and insulates the first electrode layers electrically from the at least one stack circumferential region, and lastly electrically conductive material to form the second contacting structure is applied to the prepared stack circumferential region.

An advantage of the proposed method is that processes necessary hitherto, which involve materials harmful to health, such as, for example, solvents, may be dispensed with. In particular, the application of polyimide passivation may be dispensed with. This makes things much easier since such passivation requires high accuracy in terms of layer thickness, homogeneity and positional accuracy for functioning capacity and a long service life. The application of a conductive adhesive layer with materials likewise harmful to humans may also be dispensed with.

The step of generating the stack comprises the provision of an unsintered stack composed of the alternately arranged material layers and first and second electrode layers, the material layers, the first electrode layers, which are to be connected to the first contacting structure, and the second electrode layers, which are to be connected to the second contacting structure, having a different shrinkage behavior during sintering.

Furthermore, the step of generating the stack comprises the sintering of the stack, with the result that the first electrode layers project beyond the at least one stack circumferential region, and the second electrode layers come to lie within the material layers at a distance from the at least one stack circumferential region.

The materials of the first and second electrode layers and of the material layers are selected in such a way that, during the sintering of the stack, the second electrode layers shrink to a greater extent than the material layers and the material layers shrink to a greater extent than the first electrode layers.

This procedure makes it possible to apply the first contacting structure directly, without an insulating structure having to be provided beforehand. This does away with processes in which materials required for passivation have to be applied with extreme accuracy in terms of layer thickness, homogeneity and positional accuracy.

In particular, the application of the first contacting structure may take place by burning the material of the first contacting structure onto the at least one stack circumferential region. This procedure is used, for example, in the case of stacks which are not fully active and is tried and tested. The contacting of the second contacting structure may take place, for example, by means of conductive adhesive.

The exposure of the second electrode layers on the at least one stack circumferential region comprises, in an expedient refinement, the grinding of the at least one stack circumferential region. A planar surface of the stack circumferential region can be achieved by grinding. At the same time, it is possible to check with high accuracy when the second electrode layers are reached.

Especially simple manufacture is obtained in that the first and the second contacting structure are formed on different stack circumferential regions. Preferably, the two stack circumferential regions lie opposite one another and come to lie parallel to one another.

The generation of the insulating structure takes place, according to an expedient refinement, by electrochemical deposition, in that voltage is applied to the first contacting structure. Targeted passivation of the already contacted electrodes on the region on which the second contacting structure is to be generated can thereby take place. The procedure is based on the deposition of an insulating material which takes place in an electrolytic bath by means of electrical voltage which is applied between the electrode, already present on the stack, and a second electrode in this electrolytic bath. For this purpose, it is necessary for all the electrodes of the stack to look out at the surface of the stack circumferential region yet to be contacted.

Another embodiment provides an electronic structural element formed as a stack. This comprises a plurality of first and second electrode layers and a plurality of material layers reacting to the application of an electrical field, each material layer being arranged alternately between a first and a second electrode layer. A first and a second contacting structure are applied to at least one stack circumferential region, so that every first electrode layer is contacted electrically by the first contacting structure and every second electrode layer is contacted electrically by the second contacting structure. The first contacting structure is applied directly to the at least one stack circumferential region, the first electrode layers which project from the at least one stack circumferential region being embedded in an electrically conductive manner into the first contacting structure. The second contacting structure is applied to a solvent-free insulating structure of the at least one stack circumferential region of the stack and is connected electrically to the second electrode layers.

The proposed structural element can be produced in a more environmentally compatible way. Furthermore, it has a longer service life than those fully active structural elements which are produced conventionally with passivation composed of polyimide.

Figure 4:
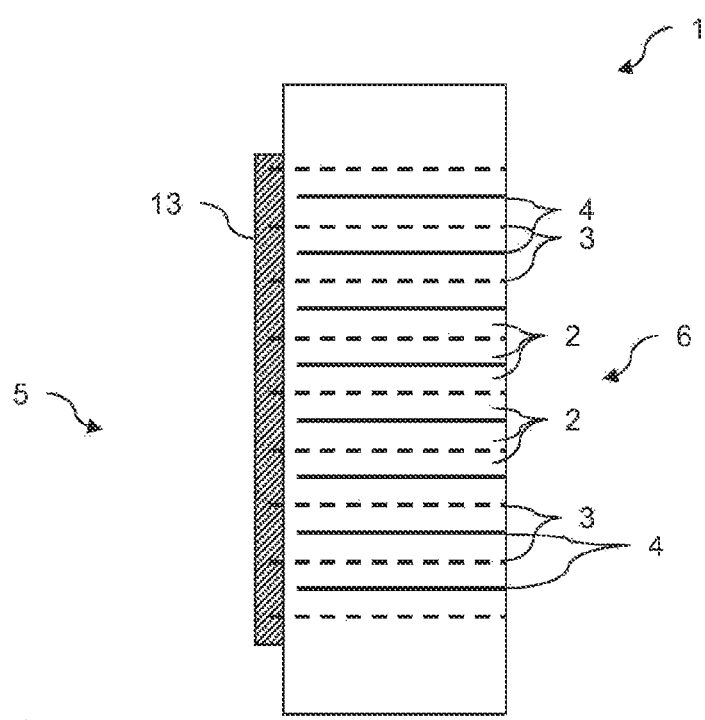
FIG. 4 shows the stack after the grinding of a stack circumferential region, to which a second contacting structure is to be applied, in a diagrammatic cross-sectional illustration.
Figure 5:
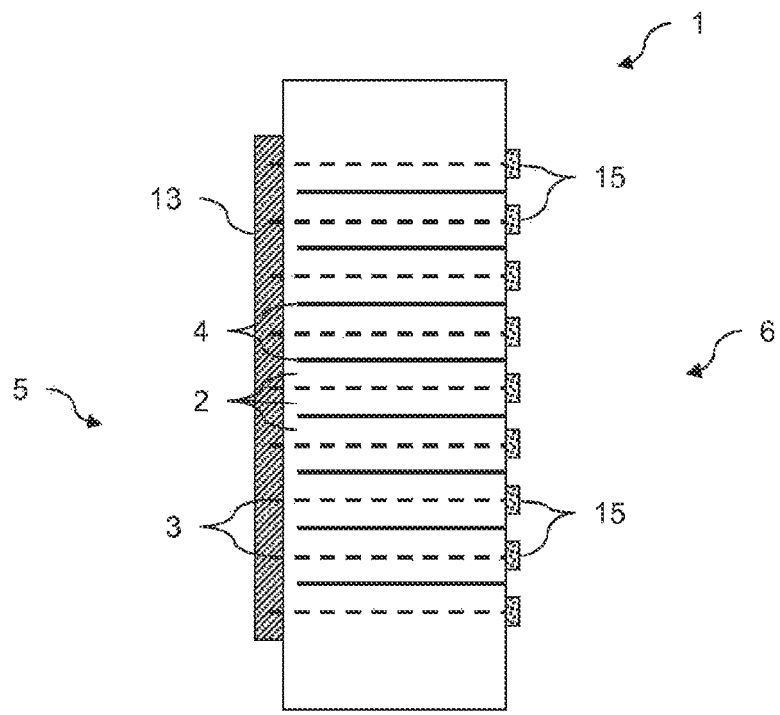
FIG. 5 shows the stack after the generation of an insulating structure on the stack circumferential region, to which the second contacting structure is to be applied, in a diagrammatic cross-sectional illustration.
Figure 6:
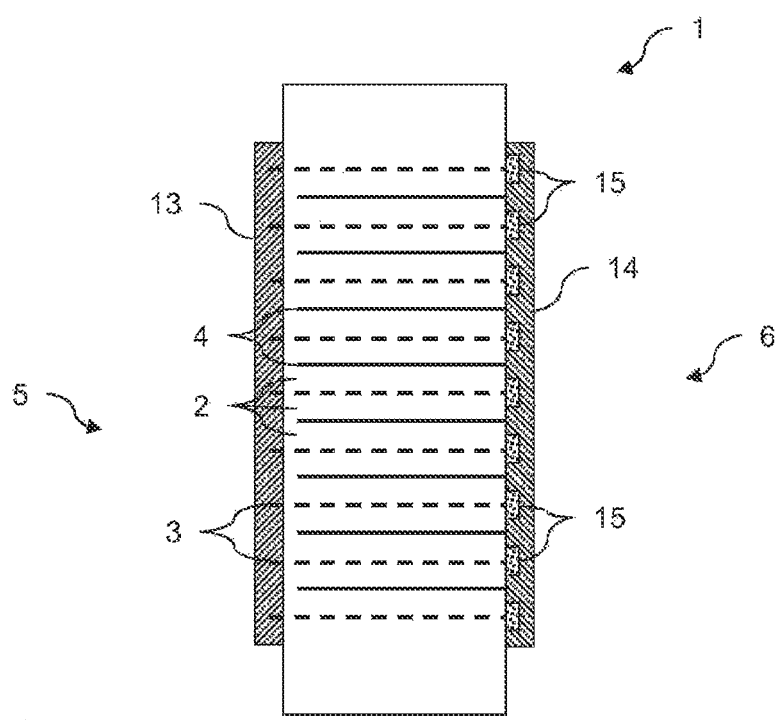
FIG. 6 shows the stack after the application of the second contacting structure for contacting second electrode layers in a diagrammatic cross-sectional illustration.

FIGS. 1 to 6 show the intermediate stages for producing the structural element according to an embodiment, shown in FIG. 6 and formed as a stack.

The starting point of the production process is an electronic structural element formed as a stack 1, as is shown in FIG. 1 in a diagrammatic sectional illustration. The stack 1 is formed from a plurality of material layers 2 reacting to the application of an electrical field and a plurality of first electrode layers 3 (illustrated as broken lines) and second electrode layers 4 (illustrated as unbroken lines). Each of the material layers 2 is arranged alternately between a first electrode layer 3 and a second electrode layer 4. The electrode layers 3, 4, since as ceramic they are still in the green state, are led on both sides up to the respective margins of the stack 1. The contacting to be generated takes place, for example, on stack circumferential regions 5, 6 lying opposite one another and not interconnected geometrically.

For the generation of a contacting structure 13 on the stack circumferential region 5 and of a contacting structure 14 on the stack circumferential region 6, it is necessary that every second electrode looks out over the stack circumferential regions 5 and/or 6 and the other electrodes come to lie within the material layers at a distance from the stack circumferential regions 5 and 6. In the exemplary embodiment, after sintering, the first electrode layers 3 project beyond the stack circumferential regions 5 and 6, and the electrode layers 4 lie inside the stack 1 (cf. FIG. 2). The electrode layers 4 may alternatively also be flush with the surfaces of the stack circumferential regions 5, 6.

In order to achieve this, the nature of the material of the first and second electrode layers 3, 4 is different, so that these have a different shrinkage behavior during sintering. This means that, even during the sintering of the green ceramic, the material layers and the electrode layers behave differently in terms of shrinkage.

In the next step (cf. FIG. 3), a first contacting structure 13 (what is known as external contacting) is applied to the stack circumferential region 5. This may take place, for example, by a metallic material being burnt in. The burning in of, for example, silver electrodes is sufficiently known to a person skilled in the art. In this method, a plurality of layers of a silver paste are applied and burnt in. The reason for this plurality of layers is that adhesion to the ceramic is possible only by means of additives in the silver paste. This additive is reduced from layer to layer, so that the uppermost layer no longer contains additives. Finally, further contacting is then soldered onto this. As a result, the first contacting structure 13 is connected in each case to every second electrode, that is to say the first electrode layers 3, so that, when voltage is applied to the contacting structure, all the electrode layers 3 have the same potential.

In order to connect the other electrodes, that is to say the second electrode layers 4, to another potential, the opposite stack circumferential region 6 of the stack is ground down. Grinding down takes place in such a way that all the electrode layers 3, 4 are contiguous to the surface of the stack circumferential region 6. This situation is illustrated in FIG. 4. Grinding has the advantage that the stack circumferential region has a planar surface before the second contacting structure 14 is generated.

By an electrical field being applied to the already generated first contacting structure 13, targeted passivation of the first electrode layers 3, connected electrically to the first contacting structure 13, is achieved on the stack circumferential region 6 with the aid of electrochemical deposition. In FIG. 5, the insulating strips 15 extend perpendicularly into the sheet plane correspondingly to the run of the first electrode layers 3.

In a last step, the second contacting structure 14 is applied to the stack circumferential region 6. The second electrode layers are thereby connected electrically to the contacting structure 14. This is shown in FIG. 6. The application of the second contacting structure may take place, for example, by means of conductive adhesive.

The stack 1 thus produced serves, for example, as a piezo-actuator for a piezo-injector for an internal combustion engine.

The production method described makes it possible to dispense with polyimides harmful to health. A further advantage is that processes can be used throughout which do not place strict requirements upon layer thicknesses, homogeneity and positional accuracy. The production method is thereby simplified.

What is claimed is:

1. An electronic structural element comprising:
   a plurality of first electrode layers;
   a plurality of second electrode layers stacked alternately between individual layers of the plurality of first electrode layers;
   a plurality of material layers, the material reacting to application of an electrical field, each material layer sandwiched alternately between a respective first electrode layer and a respective second electrode layer;
   the first electrode layers, second electrode layers, and material layers forming a stack with at least two circumferential regions;
   a first contacting structure and a second contacting structure, each applied to a respective stack circumferential region such that every first electrode layer is contacted electrically by the first contacting structure and every second electrode layer is contacted electrically by the second contacting structure;
   wherein the first contacting structure directly contacts a first stack circumferential region including each of the plurality of first electrode layers radially projecting from the first stack circumferential region and thereby embedded in an electrically conductive manner into the first contacting structure; and
   wherein the second contacting structure is applied to a solvent-free insulating structure on a second stack circumferential region of the stack and connected electrically to each of the plurality of second electrode layers.

2. The electronic structural element of claim 1, wherein the material layers, the first electrode layers, and the second electrode layers are formed from materials having a different shrinkage behavior during sintering.

3. The electronic structural element of claim 1, wherein the material layers, the first electrode layers, and the second electrode layers are formed from materials that provide, upon sintering of the stack, the first electrode layers project radially beyond the first stack circumferential region, and the second electrode layers lie radially within and spaced inwardly from the first stack circumferential region.

4. The electronic structural element of claim 1, wherein the first and second electrode layers and the material layers are formed from materials that provide that, during a sintering of the stack, the second electrode layers shrink to a greater extent than the material layers and the material layers shrink to a greater extent than the first electrode layers.

5. The electronic structural element of claim 1, wherein the material of the first contacting structure is burned onto the first stack circumferential region.

6. The electronic structural element of claim 1, wherein the first and the second stack circumferential regions are different stack circumferential regions.

7. The electronic structural element of claim 1, wherein the insulating structure comprises an electrochemically deposited structure.

* * * * *